US009893701B1

(12) United States Patent
Plasterer et al.

(10) Patent No.: US 9,893,701 B1
(45) Date of Patent: Feb. 13, 2018

(54) POWER FILTERING CIRCUIT AND METHOD

(71) Applicant: Microsemi Solutions (U.S.), Inc., Aliso Viejo, CA (US)

(72) Inventors: John Plasterer, Coquitlam (CA); Yuming Tao, Ottawa (CA)

(73) Assignee: Microsemi Solutions (U.S.), Inc., Aliso Viejo, CA (US)

( * ) Notice: Subject to any disclaimer, the term of this patent is extended or adjusted under 35 U.S.C. 154(b) by 163 days.

(21) Appl. No.: 14/708,126

(22) Filed: May 8, 2015

(51) Int. Cl.
| *H03H 7/01* | (2006.01) |
| *H05K 1/02* | (2006.01) |
| *H01L 23/498* | (2006.01) |
| *H01L 23/50* | (2006.01) |
| *H05K 7/14* | (2006.01) |
| *H03H 1/00* | (2006.01) |

(52) U.S. Cl.
CPC ..... *H03H 7/0115* (2013.01); *H01L 23/49827* (2013.01); *H01L 23/50* (2013.01); *H03H 7/0153* (2013.01); *H03H 7/1741* (2013.01); *H05K 1/0298* (2013.01); *H05K 7/1457* (2013.01); *H03H 2001/0085* (2013.01)

(58) Field of Classification Search
CPC ...... H05K 1/11; H05K 7/1457; H05K 1/0298; H03H 2001/0085; H03H 7/0115; H03H 7/1741; H03H 7/0153
USPC .................................. 333/181, 185; 361/794
See application file for complete search history.

(56) References Cited

U.S. PATENT DOCUMENTS

| 5,488,540 A | * | 1/1996 | Hatta | H05K 1/0225 174/260 |
| 6,202,191 B1 | | 3/2001 | Filippi et al. | |
| 7,002,434 B2 | * | 2/2006 | Lin | H03H 7/09 333/167 |
| 7,605,460 B1 | | 10/2009 | Wu et al. | |
| 2009/0140825 A1 | * | 6/2009 | Atsumo | H01F 17/0006 333/164 |

OTHER PUBLICATIONS

Wu et al., "Overview of Power Integrity Solutions on Package and PCB: Decoupling and EBG Isolation", IEEE Transactions on Electromagnetic Compatibility, May 2010, vol. 52, No. 2, pp. 346-356.

(Continued)

*Primary Examiner* — Rakesh Patel
(74) *Attorney, Agent, or Firm* — Leber IP Law; Dennis R. Haszko

(57) ABSTRACT

A power filter circuit is provided for use in a package substrate for integrated circuits. A first power isolation circuit, having a first inductance, is configured to isolate power provided to one or more die connectors for provision to an integrated circuit die. A second power isolation circuit, having a second inductance, is configured to isolate power provided to one or more printed circuit board (PCB) connectors for provision to a PCB. A power plane electrically connects a first end of the first power isolation circuit to a first end of the second power isolation circuit, forming a "π" power filtering structure in some embodiments. A de-coupling capacitor can be provided as a surface-mount capacitor, or as an embedded capacitor in a core layer of an integrated circuit package.

15 Claims, 14 Drawing Sheets

(56) References Cited

OTHER PUBLICATIONS

Nickel et al., "A Novel Decoupling Capacitance Platform for Substrates, Sockets, and Interposers", 2004 Electronics Packaging Technology Conference, Dec. 2004, pp. 231-234.

Tavallaee et al., "A New Approach to the Design of Power Distribution Networks Containing Electromagnetic Bandgap Structures", 2006 IEEE Electrical Performance of Electronic Packaging, Oct. 2006, pp. 43-46.

* cited by examiner

POWER FILTERING CIRCUIT AND METHOD

FIELD

The present disclosure relates to integrated circuits, including but not limited to power distribution networks and power filtering.

BACKGROUND

A power distribution network (PDN) is provided to redistribute power from a power source, such as a printed circuit board (PCB), via one or more multi-layer stacked substrates or packages, to the circuitry blocks in an integrated circuit (IC).

Power distribution network design has become important in the design of packages and PCBs for the applications of high-speed circuits or mixed-signal systems with faster data-rate and higher integration.

Conventional PDNs in a ball-grid array (BGA) package receive power across a bottom layer substrate attached to the PCB board with an array of metal balls. The PDN conducts the power through build-up (BU) layers and core layers using vertical via connections. The power is distributed to the top surface layers with metal bumps attached to the IC.

PDNs also work with on-die de-coupling capacitors to filter the self-induced noise from switching activities in the integrated circuit (also referred to as "power supply self-induced noise"). Despite the filter, self-induced noise can propagate between adjacent circuit blocks through connected power regions. Accordingly, multiple PDNs are used in an IC, each PDN for powering a different block in the IC. However, having multiple PDNs complicates the design, and increases the cost, of the package and the PCB.

Improvements in power distribution network design are desirable.

BRIEF DESCRIPTION OF THE DRAWINGS

Embodiments of the present disclosure will now be described, by way of example only, with reference to the attached Figures.

DETAILED DESCRIPTION

Figure 1:
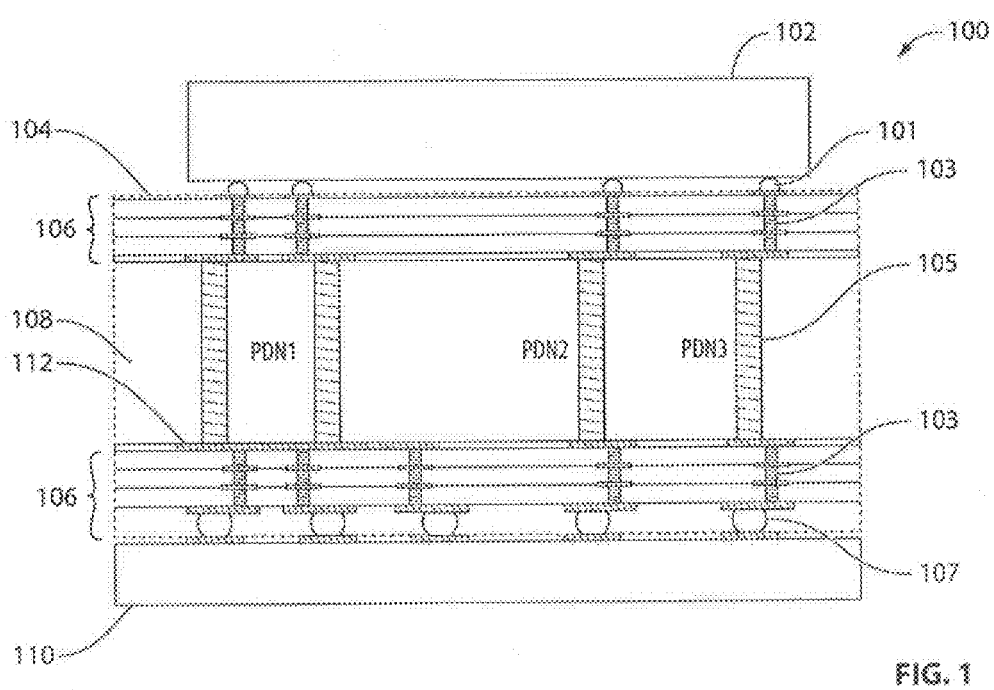
FIG. 1 illustrates a cross-section view of a conventional die-package-PCB PDN.

A power filter circuit is provided for use in a package substrate for integrated circuits. A first power isolation circuit, having a first inductance, is configured to isolate power provided to a die connector for provision to an integrated circuit die. A second power isolation circuit, having a second inductance, is configured to isolate power provided to a printed circuit board (PCB) connector for provision to a PCB. A power plane electrically connects a first end of the first power isolation circuit to a first end of the second power isolation circuit, forming a "π" power filtering structure in some embodiments. A de-coupling capacitor can be provided as a surface-mount capacitor, or as an embedded capacitor in a core layer of an integrated circuit package.

In an embodiment, the present disclosure provides a power filter circuit for use in a package substrate for integrated circuits. The power filter circuit comprises: a first power isolation circuit configured to isolate power provided to one or more die connectors for provision to an integrated circuit die, the first power isolation circuit having a first inductance; a second power isolation circuit configured to isolate power provided to one or more printed circuit board (PCB) connectors for provision to a PCB, the second power isolation circuit having a second inductance; and a power plane electrically connecting a first end of the first power isolation circuit to a first end of the second power isolation circuit.

In an example embodiment, the power filter circuit further comprises: a package ground network; and a de-coupling capacitor in electrical communication with the power plane and with the package ground network.

In an example embodiment, the de-coupling capacitor comprises one or more surface mount (SMT) capacitors provided on a surface of the package. In an example embodiment, the de-coupling capacitor is in direct electrical communication with the package ground network.

In an example embodiment, the power filter circuit further comprises: one or more upper build-up (BU) layer vias provided in an upper BU layer of the package and extending between and connecting the power plane with the package ground network and the de-coupling capacitor. In an example embodiment, the de-coupling capacitor is in electrical communication with the power plane by way of the one or more upper BU layer vias.

In an example embodiment, the de-coupling capacitor comprises an embedded capacitor provided in a core layer of the package.

In an example embodiment, the one or more upper BU layer vias comprise an array of upper BU layer vias.

In an example embodiment, the first power isolation circuit comprises one or more core vias provided in a core layer of the package.

In an example embodiment, the one or more core vias comprise a plurality of multi-stacked core vias provided in a core layer of the package.

In an example embodiment, the second power isolation circuit comprises one or more core vias provided in a core layer of the package.

In an example embodiment, the second power isolation circuit comprises a planar inductor. In an example embodiment, the planar inductor is provided on a surface layer, on a build-up layer or in a top core layer of the package substrate.

In an example embodiment, the power filter circuit further comprises: one or more lower build-up (BU) layer vias provided in a lower BU layer of the package and electrically connecting a mini power plane in a core layer of the package with the one or more PCB connectors.

In another embodiment, the present disclosure provides a power filter circuit for use in a package substrate for integrated circuits. The power filter circuit comprises: a power plane; a first inductance circuit having a first inductance, the first inductance circuit being provided between the power plane and a die connector to isolate power provided to a first power distribution network connected between the power plane and the die connector; and a second inductance circuit having a second inductance and being provided between the power plane and a printed circuit board (PCB) connector to isolate power provided to a second power distribution network connected between the power plane and the PCB connector.

In an example embodiment, the power filter circuit further comprises: a de-coupling capacitor in electrical communication with the power plane.

In a further embodiment, the present disclosure provides an integrated circuit package comprising: a package substrate; one or more die connectors provided on a first surface of the package substrate and configured to provide power to an integrated circuit die; one or more printed circuit board (PCB) connectors provided on a second surface of the package substrate and configured to provide power to a PCB; and a power filter circuit provided in the package substrate. The power filter circuit comprises: a first power isolation circuit configured to isolate power provided to the die connector, the first power isolation circuit having a first inductance; a second power isolation circuit configured to isolate power provided to the PCB connector, the second power isolation circuit having a second inductance; and a first power plane electrically connecting a first end of the first power isolation circuit to a first end of the second power isolation circuit.

In an example embodiment, the integrated circuit package further comprises: first and second power distribution networks (PDNs); and a second power plane electrically connecting power to the first and second PDNs to provide a merged power plane within the package substrate.

In an example embodiment, the integrated circuit package further comprises: a lower build-up (BU) layer provided between the power filter circuit and the one or more PCB connectors, the lower BU layer having a conductive layer. The second power plane is provided on the conductive layer of the lower BU layer.

In an example embodiment, the integrated circuit package further comprises: a lower build-up (BU) layer provided between the power filter circuit and the one or more PCB connectors, the lower BU layer comprising one or more lower BU layer vias electrically connecting the second power plane with the one or more PCB connectors.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described.

Prior to discussing embodiments of the present disclosure, some additional context is provided. The design of power distribution networks in modern high speed electronic systems has become an ever-growing challenge. To some extent it has reached a state when it is equally as important as the signal-integrity design. Challenges stem from the simultaneous functions that the power distribution network must provide: 1) clean power to each individual circuitry block, 2) return path for high-speed signals, and 3) filtering function to suppress the system's self-induced noise and block the noise coupling from adjacent and/or external sources. For very large scale integrated circuits, such as a system-on-chip (SOC) or system-in-package (SIP), there are additional challenges such as increasing power density pushing the required impedance levels into the mΩ range and the number of independent supply rails increasing. Some large scale SOC with high-speed transceiver or SERDES interfaces today would require up to several dozens of independent supply rails to achieve superior signal integrity and power integrity performance. This is a big challenge since the number of supply rails usually is equal to the number of power distribution networks.

As an interface with an IC die and PCB, the package substrate may not only serve as a mixed signal routing medium but also act as a power distribution network. The latter may be comprised of multiple conductive layers, with pairs of conductor layers being assigned as power and ground plane pairs. Each power and ground plane pair is separated by an insulative layer made of a dielectric material. Typically, the connection from the power and ground planes to the IC and PCB are through a vertical via or via-array, or both. In addition, PDN design may also be involved with surface mount decoupling capacitors, isolation, and electromagnetic band gap (EBG) and other known approaches. The surface mount decoupling capacitor fails to provide noise isolation at mid and high frequencies due to its series inductance. The isolation and planar electromagnetic band gap approaches make use of narrow slots etched on the power or ground planes to isolate the noisy circuits from other sensitive circuits, and to prevent the propagation of power and ground noise. However there are different challenges such as higher fabrication and material cost, performance shortage etc. for these approaches to be implemented on a high density package substrate.

FIG. 1 illustrates a cross-section view of a conventional die-package-PCB PDN design example, showing three different PDNs labelled PDN1, PDN2 and PDN3. In FIG. 1, one or more flip-chip die 102 may interface with a package substrate 104 by way of one or more die connectors 101, for example solder bumps or copper pillars. The active side of the die 102 contains an array of pads upon which die connectors 101 are attached. Package substrate 104 has a corresponding array of pads at the surface, which electrically combine with die connectors 101 to form the interconnection between die 102 and package substrate 104. The bottom of package substrate 104 also contains an array of pads upon which PCB connectors 107 are attached, so as to accommodate the interconnection between package substrate 104 and printed circuit board 110.

Conventional package power distribution networks receive power from the PCB 110 via a PCB connector 107, such as a ball-grid array (BGA) including solder balls attached to the bottom layer of package substrate and redistribute the power to one or more lower build-up (BU) layers 106 at the bottom side of package substrate. The PDN thereby conducts the power through the lower BU layers 106 and core layers 108, and upper BU layers 106 using vertical via connections, which may comprise a stacked BU via 103 and core-via 105, or an array of stacked BU 103 and core vias 105. The power arrives at the bump pads at the top surface layers with metal bumps 101 attached to the die 102, and is then redistributed to IC die 102.

PDNs provide the clean power to each individual circuitry block inside the die 102 and also work with on-die de-coupling capacitors to filter the self-induced noise from switching activities in the integrated circuit inside the die 102 (also referred to as "power supply self-induced noise"). Examples of such individual circuitry blocks, or integrated circuits, are shown as 221 and 222 in FIG. 2 inside the die 220. Despite the filter, self-induced noise can propagate among adjacent circuit blocks through connected power regions. Accordingly, multiple PDNs are used in an IC, each PDN for powering a different block in the IC. Some large scale SOC or SIP would require up to several dozens of independent supply rails. Multiple PDNs, however, complicates the design, and increases the cost, of the package and the PCB. There are known approaches to isolate the noise coupling across different power domains, some of which have been tried on package and PCB PDN design.

Embodiments of the present disclosure provide a power filter circuit, also referred to as a "π" power filtering structure, for integration in a package substrate to isolate or reduce the power supply noise cross-coupling among different PDNs, which provides one or more of the following: enables the power domains to be merged on PCB and/or Package; simplifies PCB PDN design; and reduces BOM cost of the system. Embodiments of the present disclosure are different from available embedded thin film capacitors, which require substrates with different materials implemented between the power and ground planes. The thin film capacitor increases the manufacturing cost. Embodiments of the present disclosure do not require the power and ground planes to be etched like some embedded filter or planar EBG technologies. Therefore, embodiments of the present disclosure do not add signal integrity problem to the signal traces above and below the power and ground planes.

Furthermore in a "π" power filtering structure according to an embodiment of the present disclosure, one or more commercial surface mount (SMT) capacitors can be used to filter the noise. The inductance of the vertical BU-via and core-via form two legs of a "π" structure used to isolate the noisy circuit block from other sensitive circuit blocks. These vertical via connections already exist in the package to connect the planar layers from the top to the bottom so the present invention requires no package material and/or stack-up change. Therefore, it provides a cost effective method for the noise isolation and filtering as dual functions.

Figure 2:
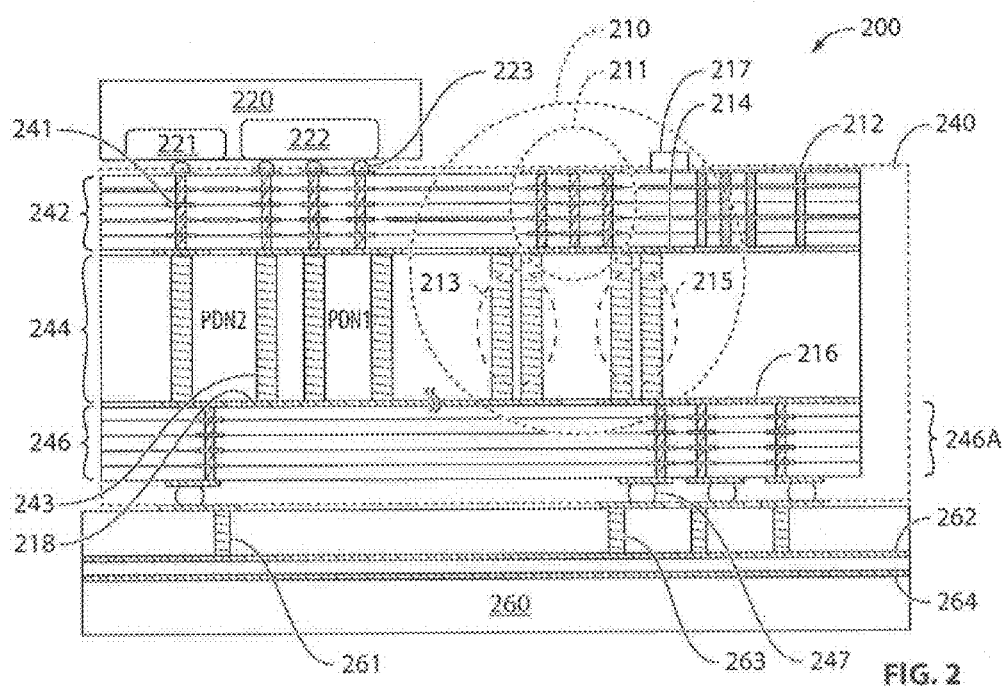
FIG. 2 illustrates a cross-section view of a die-package-PCB PDN including a power filter circuit according to an embodiment of the present disclosure.
Figure 4:
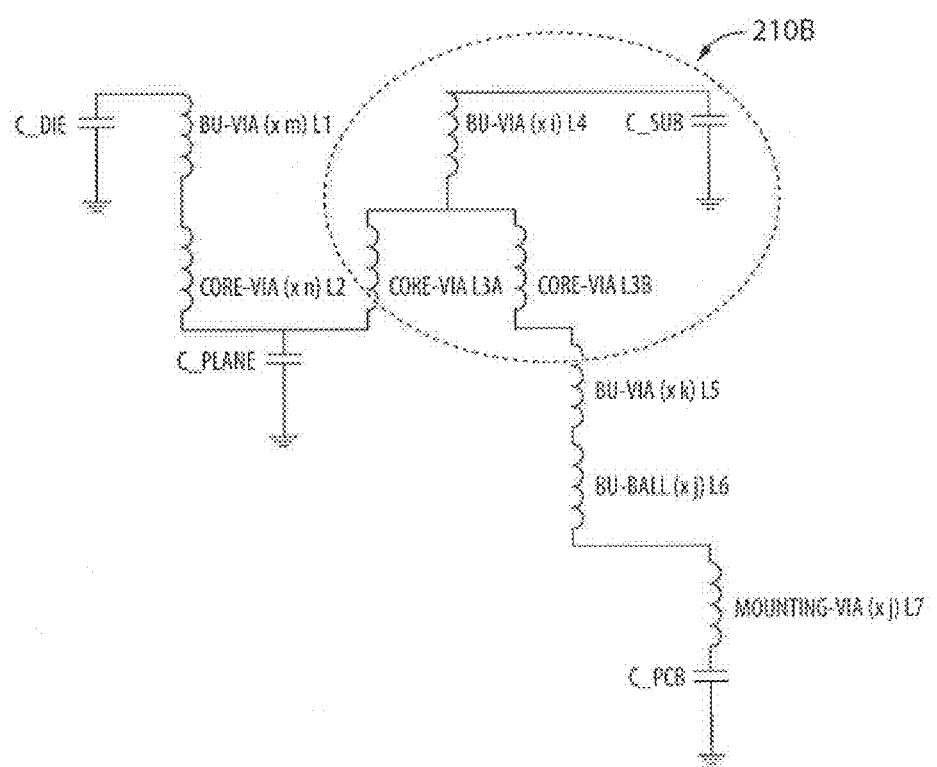
FIG. 4 illustrates an equivalent circuit corresponding to a PDN according to an embodiment of the present disclosure.

FIG. 2 illustrates a cross-section view of a die-package-PCB PDN including a power filter circuit according to an embodiment of the present disclosure. A power filter circuit 210 is provided for use in a package substrate for integrated circuits. The power filter circuit comprises a first power isolation circuit 213, which is provided in FIG. 2 as a left leg of the power filter circuit 210. The first power isolation circuit 213 is configured to isolate power provided to, or going to, a die connector, for provision to an integrated circuit die. The first power isolation circuit 213 has a first inductance, which can be expressed as L3a as shown in FIG. 4. A second power isolation circuit 215 is provided in FIG. 2 as a right leg of the power filter circuit 210, and is configured to isolate power provided to, or going to, a PCB connector, such as BGA balls, for provision to a PCB. The second power isolation circuit 215 has a second inductance, which can be expressed as L3b as shown in FIG. 4. A power plane 214 electrically connects a first end of the first power isolation circuit 213 to a first end of the second power isolation circuit 215. In the embodiment of FIG. 2, the first ends of the first and second power isolation circuits comprise a power plane connection end.

As shown in the embodiment of FIG. 2, the power filter circuit 210 also comprises a package ground network 212, also referred to as a ground return network, and a de-coupling capacitor 217 in electrical communication with the power plane 214 and the package ground network 212. In an example embodiment, the de-coupling capacitor 217 is in direct electrical communication with the package ground network 212. In an example embodiment, the de-coupling capacitor 217 comprises a surface mount (SMT) capacitor provided on a surface of the package. The power filter circuit 210 of FIG. 2 further comprises one or more upper build-up (BU) layer vias 211. The upper BU layer vias 211 extend between and connect the power plane 214 with the package ground network 212 and the de-coupling capacitor 217. In the embodiment of FIG. 2, the one or more BU layer vias comprises an array of BU vias. In an example embodiment, the de-coupling capacitor 217 is in electrical communication with the power plane 214 by way of the one or more upper BU layer vias 211.

In FIG. 2, power distribution networks PDN1 and PDN2 are illustrated within an interaction among semiconductor die, package and printed circuit board 200, while multiple stacked upper build-up (BU) layers 242, core-layer 244, stacked BU via or via-array 241, and core-via or array 243 are utilized to form the power distribution network within the package substrate 240. As described above, in an embodiment the power filtering structure 210 is provided in communication with the PDNs, and comprises a few pairs of power and ground planes 214, 216 and 212 etc., a pair of core-via arrays 213/215 shaped as two legs of the "π" structure, a set of BU vias or via-array 211, one surface mount (SMT) capacitor 217, and package ground network 212.

The PDN1 in FIG. 2 is arranged to receive power at the bottom layer of package substrate which is attached to the surface of printed circuit board (PCB) 260 via ball grid array (BGA) balls, conduct the power to the mini-plane 216 at the bottom of core layer 244 through BU stacked via array. The power travels through the right-leg 215 of "π" power filtering structure reaching up to the mini-power plane 214 placed on the top core layer 244 from which the power travels back to the power plane 218 on the bottom of the core layer 244 by the left-leg 213 of "π" power filtering structure. The power is conducted from the plane 218 through the core-layer 244, and the BU layers 242 by the means of the core-via 243 and stacked BU via 241 or via array to the top of package substrate 240, whereby, the power is across the bump 223 or bump array attached to the integrated circuit (IC) die 220 and then redistributed to the circuitry block 222 within the die 220.

In the embodiment of FIG. 2, the one or more upper BU layers 242 comprises an array of stacked upper BU vias 211 connected to the top plane 214 of "π" power filtering structure to the surface layer of package substrate 240, on which a SMT capacitor 217 is placed to filter the power supply noise to the package ground network 212.

In FIG. 2, one conventional power distribution network (PDN2) receives the power from a printed circuit board (PCB) 260 via ball-grid array (BGA) balls 247 attached to the bottom layer of package substrate and redistributes the powers to one or more lower build-up (BU) layers 246 at the bottom side of package substrate. The PDN2 thereby conducts the power through the lower build-up (BU) layers 246 and core layer 244 using vertical via connections, which may be comprised of a stacked BU via 241 and core-via 243. The power arrives at the bump pads at the top surface layers with metal bumps 223 attached to the die 220 is then redistributed to the circuitry block 221 within IC die 220.

Since PDN1 and PDN2 are attached to the same voltage rail in the printed circuit board (PCB) 260, in particular, two PDNs are merged on the power plane 262 within PCB. There is high risk of the power supply self-induced noise generated from circuitry block 221 coupling to the circuit block 222 or vice versa. Embodiments of the present disclosure provide a solution to mitigate this noise cross-coupling, since the intrinsic inductance of the first and second isolation circuits 213 and 215, which in an implementation are long core-vias of "π" power filtering structure, is utilized to isolate the power supply noise coupling between the different power regions in the package. Furthermore the top layer may be connected to a SMT de-coupling capacitor 217 to help further filtering the noise.

Figure 3:
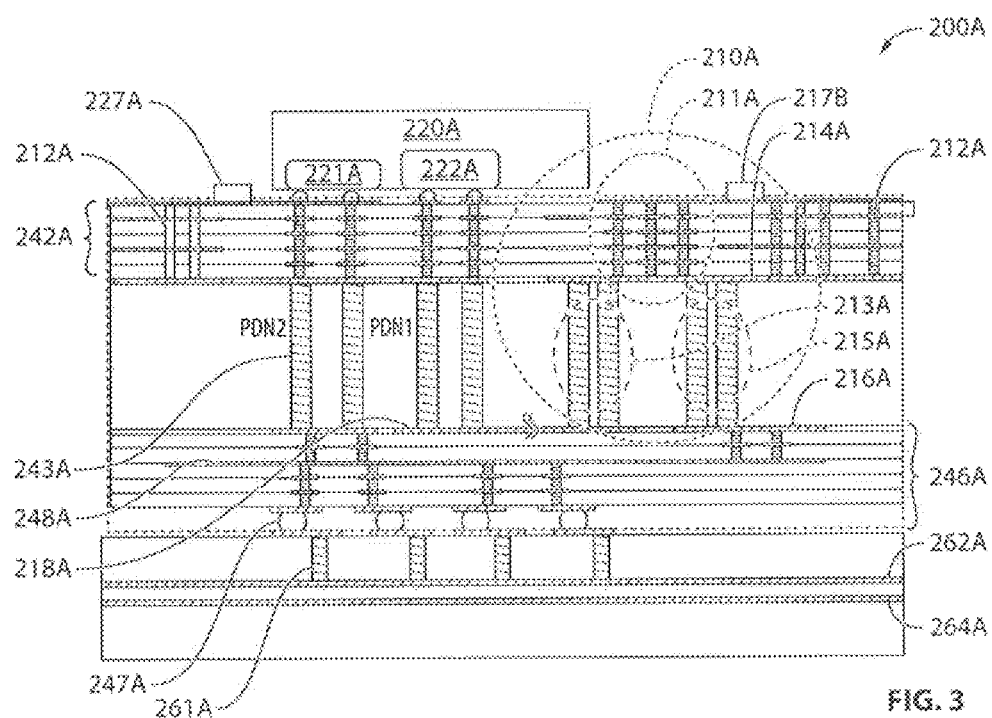
FIG. 3 illustrates a cross-section view of a die-package-PCB PDN including a power filter circuit according to another embodiment of the present disclosure.

FIG. 3 illustrates a cross-section view of a die-package-PCB PDN including a power filter circuit according to another embodiment of the present disclosure. In the embodiment of FIG. 3, the "π" power filtering structure is integrated in the power distribution network (PDN1) in the substrate package.

The differences between the embodiment of FIG. 3 and the embodiment of FIG. 2 are as follows. PDN2 additionally has one or more SMT capacitors 227A mounted on the surface conductive layer of BU portion 242A of substrate, to filter down the noise generated by the circuitry block 221A, which is deemed as a noisy block. The power of PDN2 is connected to one designated plane 248A on the conductive layer of a lower BU layer 246A of substrate through one set or array of BU-via, core-via. PDN1 has the same power connection scheme as in the embodiment as depicted in FIG. 2, but the power is then merged to the same plane 248A to which the power of PDN2 is connected. The powers of both PDN1 and PDN2 are merged on plane 248A, instead of the power being merged in the PCB, and then are provided by via-down to an array of BGA balls attached to the PCB.

FIG. 4 illustrates an equivalent circuit corresponding to a PDN according to an embodiment of the present disclosure. FIG. 4 can alternatively be described as an exemplary schematic model of the complete power distribution network of an embodiment of the present disclosure in which an on-die de-coupling capacitor (C_die), PCB de-coupling capacitors (C_pcb) and a substrate SMT de-coupling capacitor are also provided. The integral values (i, m, n, j and k) represent the actual number of BU or core vias at each physical location, whereby the equivalent inductance of via-connection is equal to the shunt of integral number of individual via's inductance. The equivalent circuit model of the power filter circuit of an embodiment of the present disclosure is depicted as 210B in FIG. 4. In 210B, the parameters of each element represent the electrical behavior of the corresponding components of the "π" power filtering structure, SMT capacitor(s) and associated the mounting parasitic.

In an embodiment of the present disclosure, the power filter circuit, or "π" power filter structure, together with the SMT de-coupling capacitor(s) are designed and optimized to dampen the anti-resonance of power distribution network (PDN1) and/or shift the anti-resonance frequency off the noise frequency range generated by the switching circuitry.

Figure 5A:
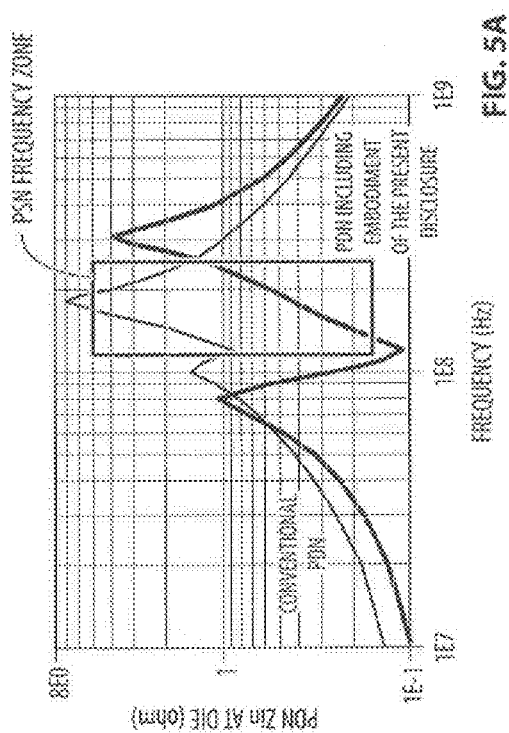
FIG. 5A is a graph illustrating a comparison of impedance of a conventional PDN and a PDN including a power filter circuit according to an embodiment of the present disclosure.

FIG. 5A is a graph illustrating a comparison of impedance of a conventional PDN and a PDN including a power filter circuit according to an embodiment of the present disclosure. FIG. 5A shows that the impedance of PDN according to an embodiment of the present disclosure has been significantly suppressed over the frequency range of power supply self-induced noise in comparison with that of the conventional PDN.

Figure 5B:
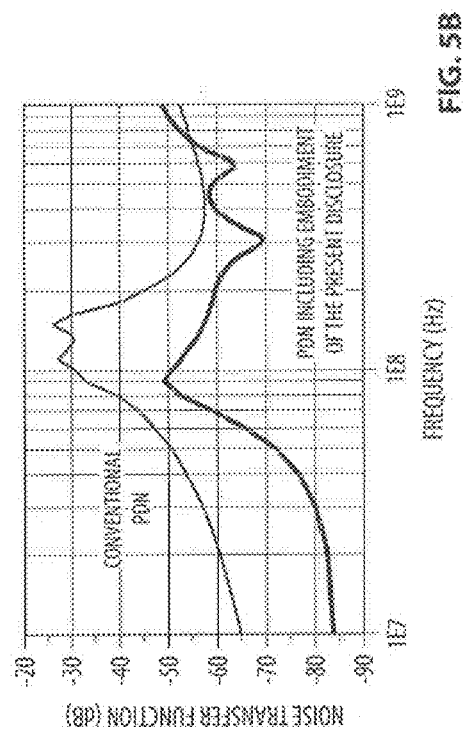
FIG. 5B is a graph illustrating a comparison of a noise transfer function of a conventional PDN and a PDN including a power filter circuit according to an embodiment of the present disclosure.

FIG. 5B is a graph illustrating a comparison of a noise transfer function of a conventional PDN and a PDN including a power filter circuit according to an embodiment of the present disclosure. FIG. 5B shows that embodiments of the present disclosure also have improved the noise isolation by over 20 dB between PDN1 and PDN2 implemented in package substrate. This improved noise isolation is a significant feature and advantage of embodiments of the present disclosure over the conventional PDN design.

FIGS. 6A, 6B, 6C and 6D illustrate cross-section views of a die-package-PCB PDN including a power filter circuit according alternative embodiments of the present disclosure with various combinations of core-via or array and BU-via or array. Various combinations of core-via or array and BU-via or array can be provided to achieve or realize an amount of inductance required for noise isolation among the different power domains, and also the least inductance path for the SMT de-coupling capacitor on the substrate.

Figure 6A:
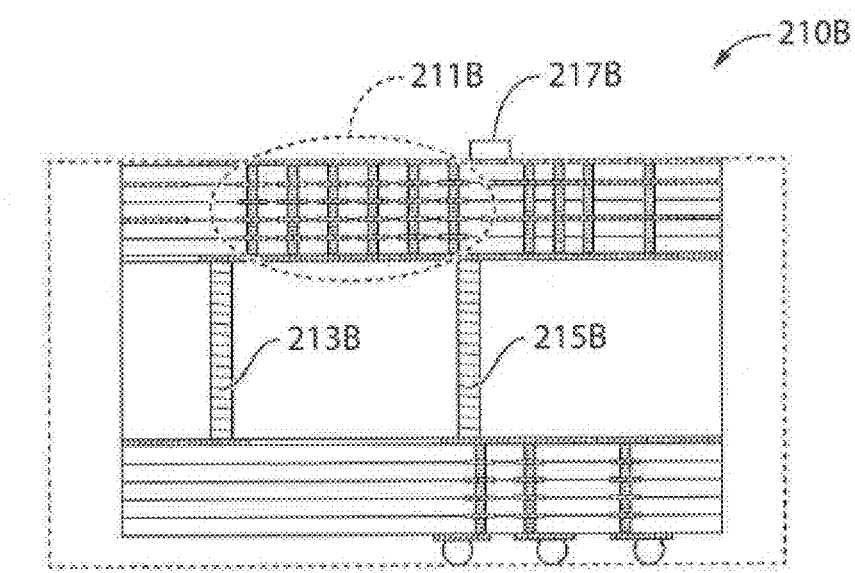
FIGS. 6A, 6B, 6C and 6D illustrate cross-section views of a die-package-PCB PDN including a power filter circuit according to alternative embodiments of the present disclosure with various combinations of core-via or array and BU-via or array.

In the power filter circuit 210B embodiment of FIG. 6A, the first power isolation circuit 213B and the second power isolation circuit 215B each comprise only one core-via, compared to 2 core-via arrays as displayed in the embodiment of FIG. 2. The one or more BU layer vias 211B comprise an array or plurality of six or more stacked BU vias, which are utilized to connect the SMT de-coupling capacitor 217B to the power filter circuit 210B, compared to an array of three BU vias as in the embodiment of FIG. 2.

Figure 6B:
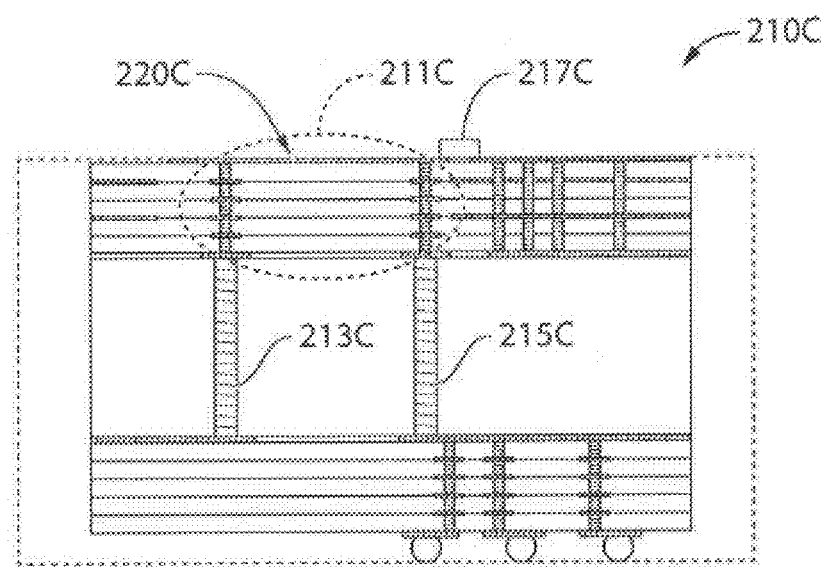

In the embodiment of FIG. 6B, power filter circuit 210C comprises a cascaded core-via and BU-via and mini power plane 220C on the surface of the substrate thereby connected to the SMT capacitor 217C. In particular, the circuit comprises a first cascaded core-via and BU-via 213C, 211C, and a second cascaded core-via and BU-via 215C, 211C. The configuration in FIG. 6B allows more inductance to be realized by this embodiment to enhance the isolation of the noise coupling among power domains.

Figure 6C:
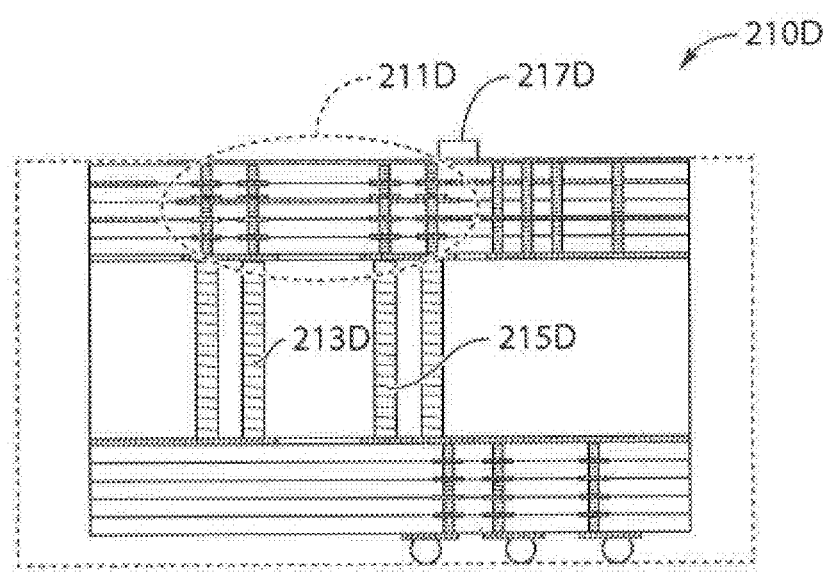

The embodiment in FIG. 6C is a variation of the embodiment of FIG. 6B in which the power filter circuit 210D comprises double cascaded BU-via and core-via sets 213D, 211D and 215D, 211D. Such an embodiment is provided to reduce the DC voltage drop along the power filter circuit 210A, or "π" power filtering structure, for a PDN carrying a large current amount while the noise isolation level is still sufficient.

Figure 6D:
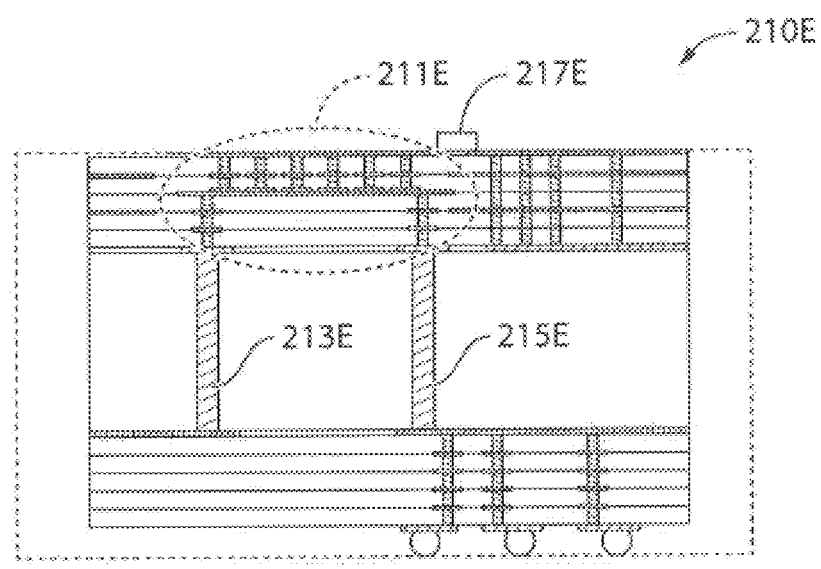

In the embodiment of FIG. 6D, the power filter circuit 210E comprises a cascaded core-via and a three-layer stacked BU-via 211E and mini power plane on the inner layer of substrate, whereby it is connected to the surface layer with a plurality of BU via array and then to SMT capacitor 217E. This provides an alternative embodiment to the embodiment of FIG. 6A and the embodiment of FIG. 6B.

Figure 7:
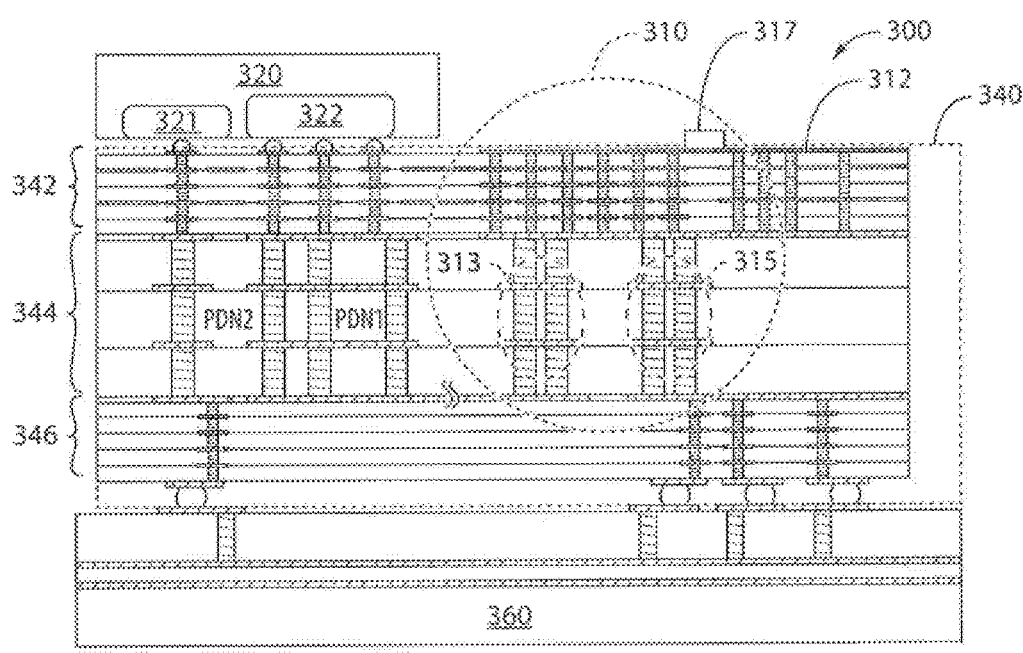
FIG. 7 illustrates a cross-section view of a die-package-PCB PDN including a power filter circuit with multi-stacked core layers according to another embodiment of the present disclosure.

FIG. 7 illustrates a cross-section view of a die-package-PCB PDN 300 including a power filter circuit 310 with multi-stacked core layers according to another embodiment of the present disclosure. In the embodiment of FIG. 7, multi-stacked core-layers 344 are provided in the package substrate 340. In the power filter circuit 310, the first and second power isolation circuits 313 and 315 each comprise an array of stacked-core-vias, or a via array. In another embodiment, only one of the first or second power isolation circuits 313 or 315 comprises an array of stacked core-vias. An array of stacked BU-vias is also utilized to connect the power filter circuit 310 to the SMT de-coupling capacitor 317 mounted on the surface of package substrate.

Figure 8:
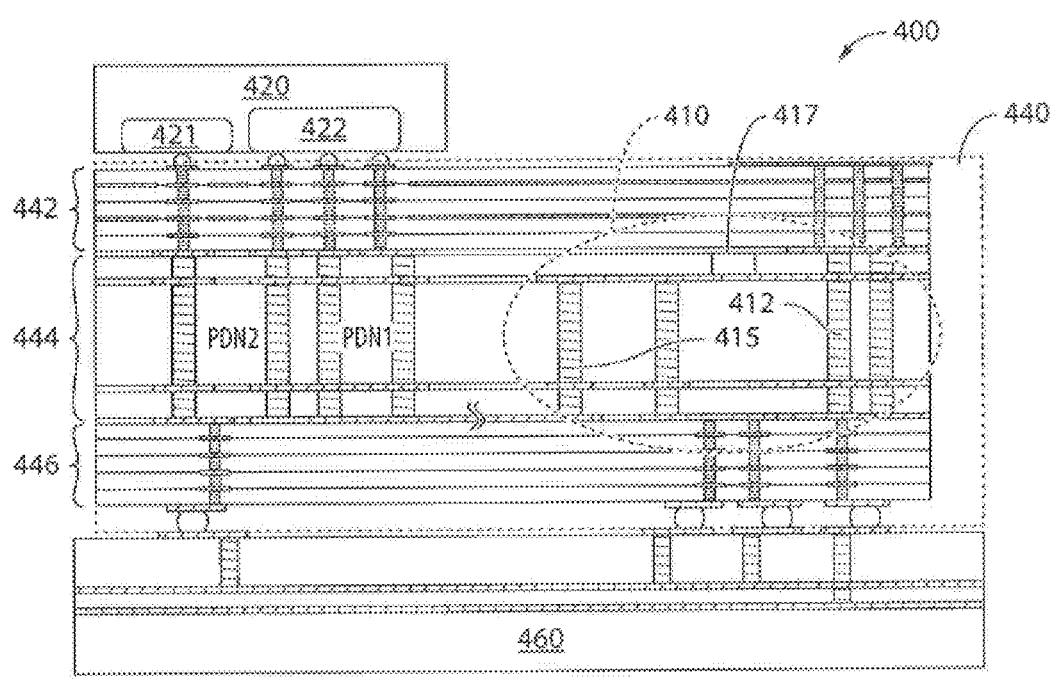
FIG. 8 illustrates a cross-section view of a die-package-PCB PDN including a power filter circuit with a de-coupling capacitor embedded in a core layer according to another embodiment of the present disclosure.

FIG. 8 illustrates a cross-section view of a die-package-PCB PDN 400 including a power filter circuit 410 with a de-coupling capacitor embedded in a core layer according to another embodiment of the present disclosure. In FIG. 8 the power filter circuit 410 is formed inside the multiple stacked core layers 444 while the de-coupling capacitor 417 is embedded in one of the core-layers. The implantation of an embedded capacitor inside the core-layers would minimize the impact of embodiments of the present disclosure on the high-speed signal routing that generally are laid on the copper layers of stacked BU substrate, at a higher cost of both material and fabrication.

Figure 9:
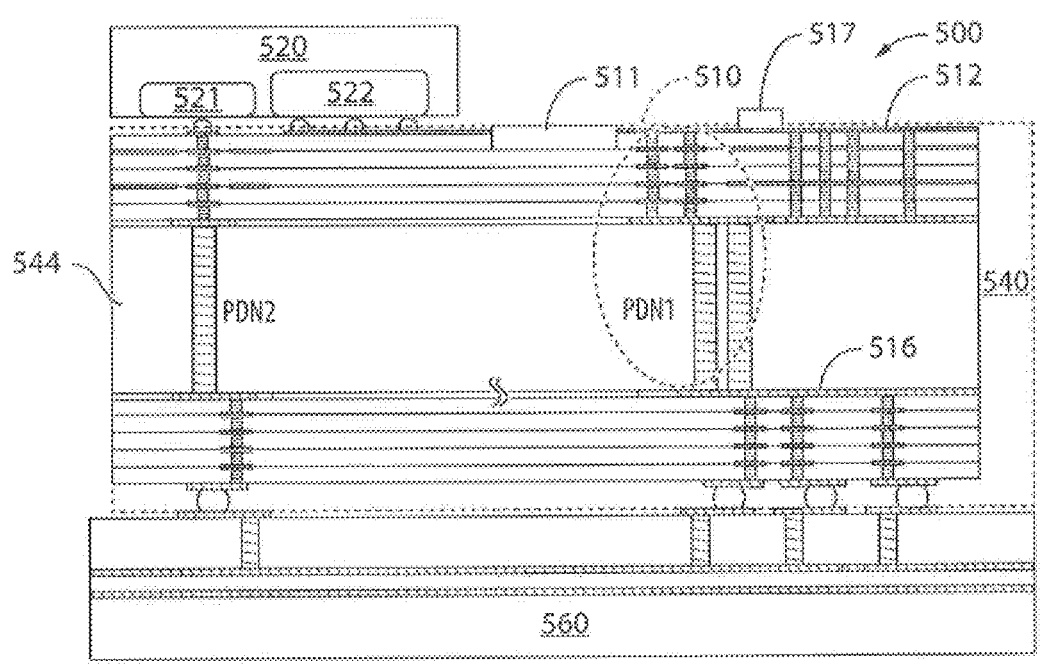
FIG. 9 illustrates a cross-section view of a die-package-PCB PDN including a power filter circuit with a power isolation circuit provided as a planar inductor according to another embodiment of the present disclosure.

FIG. 9 illustrates a cross-section view of a die-package-PCB PDN 500 including a power filter circuit 510 with a power isolation circuit provided as a planar inductor according to another embodiment of the present disclosure. In the PDN 500 in FIG. 9, one of the power isolation circuits, e.g. one leg of the "π" power filtering structure, is replaced by, or provided as, a planar inductor 511 etched on one or two metal layers inside the BU layers of package substrate. The planar inductor can be formalized by any shape of spiral inductor which exhibits the inductance satisfactory to the requirement of the "π" power filtering structure. One SMT de-coupling capacitor 517 is attached to the power filter circuit 510 to filter power supply noise along the power distribution network (PDN1).

Specific example embodiments, such as shown in FIG. 2, have been implemented in integrated circuit (IC) devices with high-speed SERDES interfaces. One advantage of the power distribution network including a power filter circuit according to an embodiment of the present disclosure relative to the conventional PDNs is significant power domain reduction as demonstrated in Table 1.

TABLE 1

| Item | PCB power domains and filter sets | |
|---|---|---|
| | Prior art PDN design | PDN design with the present invention |
| Device A | 5 | 1 |
| Device B | 4 | 1 |

Figure 10A:
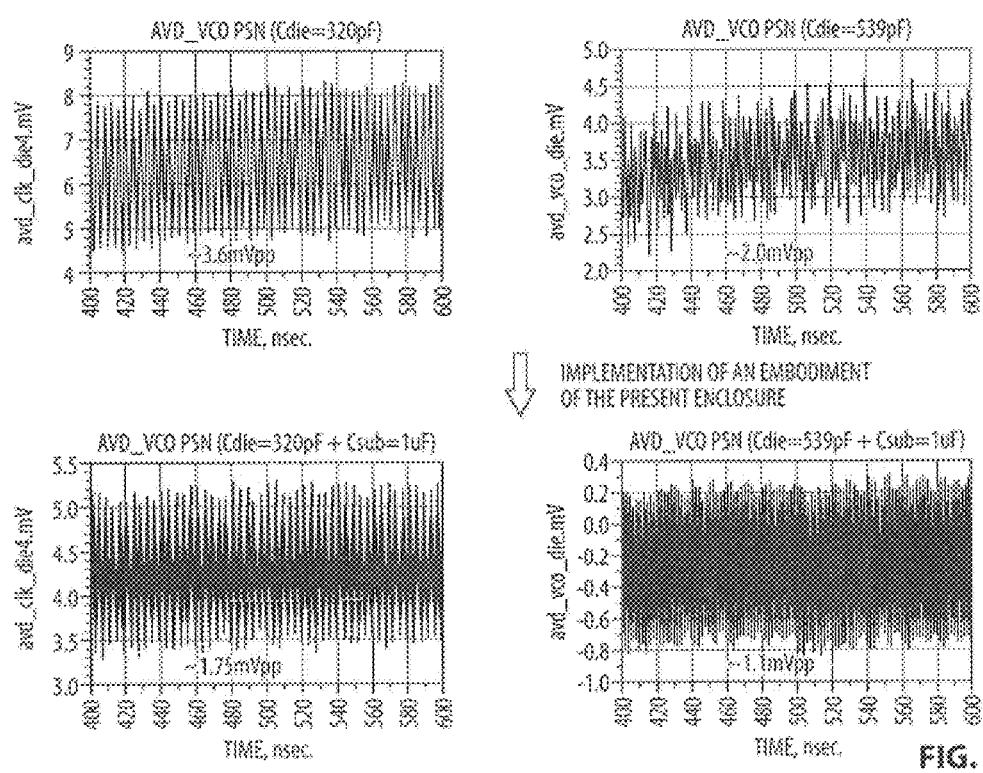
FIGS. 10A and 10B include graphs illustrating power reduction achieved using embodiments of the present disclosure.
Figure 10B:
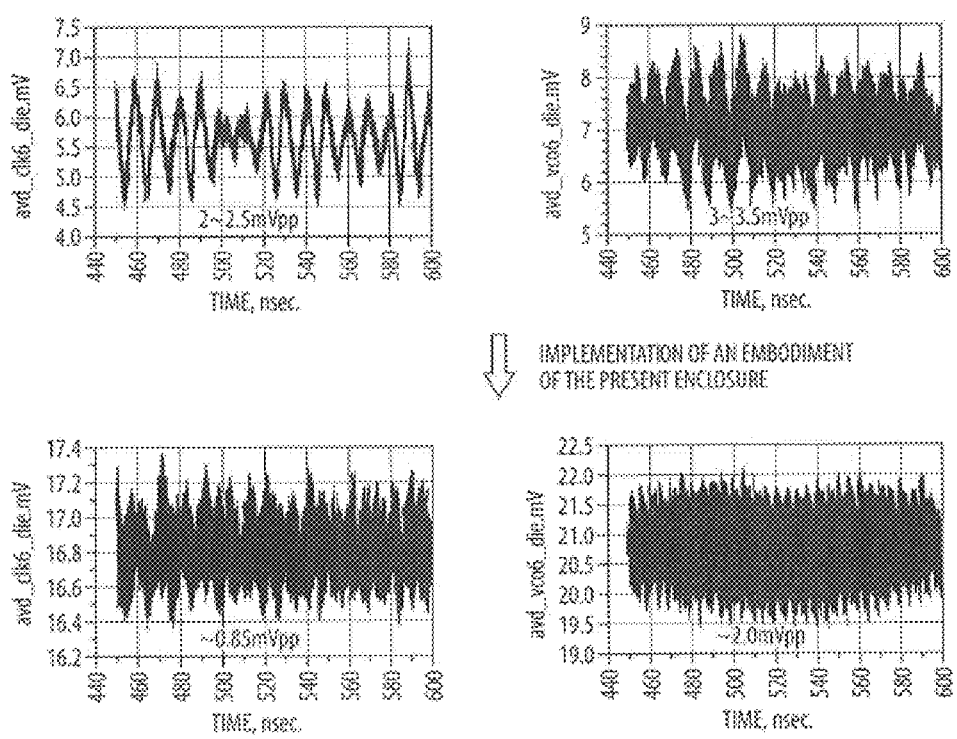

FIGS. 10A and 10B are graphs illustrating power reduction achieved using Devices A and B, respectively, from Table 1, according to embodiments of the present disclosure. As demonstrated in FIGS. 10A and 10B, the power supply self-induced noise (PSN) of sensitive powers like voltage-controlled-oscillator (VCO) and clock synthesized unit has been reduced by more than 50% for both device A and B.

The implementation of embodiments of the present disclosure simplifies printed circuit board PDN design by enabling one or more of the following: integrate de-coupling capacitors on substrate to work together with on-die de-coupling capacitors to filter power supply self-induced noise as the physical location of the power filter circuitry is close to the IC or die; isolate the critical power rail from other noisy power rails and further suppress the noise; enable power domain merge on package and/or PCB and significantly decrease the number of power rails of IC devices; simplify the PCB power filter design and reduce the bill of material (BOM) cost of customer's board; only one analog power plane is required on PCB for the IC device with an embodiment of the present disclosure compared to multi-planes required on PCB for prior devices; IC devices can be provided with high-speed SERDES interface that no longer requires PCB de-coupling capacitors at all because all the power supply noise will be filtered out by on-die de-coupling capacitors and the advanced package PDN.

In an example implementation, a power filter circuit, or "π" power filtering structure, is provided for integration in a package substrate. The package substrate includes: build-up laminate layers with a plurality of conductive layers separated by a plurality of insulating layers, each of the plurality of insulating layers having a first thickness; and a plurality of copper-clad laminate structures, each copper-clad laminate structure including conductive layers separated by an insulating layer having a second thickness; a single, or a plurality of stacked, build-up via displaced between the plurality of conductive layers of the build-up portions; a package substrate including single-layer core with conductive layers separated by an insulating layer or multi-layer core with a plurality of thicker insulating layers, each of the plurality of insulating core layers having a third thickness; and a plurality of copper-clad laminate structures, each copper-clad laminate structure including conductive layers separated by a thicker insulating layer having a fourth thickness; a plated-through via or via-array displaced between the plurality of conductive layers of the core portions, forming the primary part of "π" power filtering structure. One or more de-coupling capacitors can be placed on the surface conductive layer with one terminal of the capacitor attached to the power plane and other terminal attached to the ground plane.

The build portion can have a plurality of build-up isolative layers, as an example of 5 in the embodiment of FIG. 2, but it is not limited to 5, and can be any number of layers staring from 1. Each of the plurality of insulating layers can have a first thickness, for example 30 μm; and a plurality of copper-clad laminate structures, each copper-clad laminate structure including conductive layers separated by an insulating layer having a second thickness that could be equal to a first thickness of 30 μm, or a different thickness.

A single or a plurality of stacked build-vias can be displaced between the plurality of conductive layers of the build-up portions; furthermore, BU vias can be stacked by an offset distance across adjacent insulating layers. A stacked BU via and via-array can be displaced to connect the conductive layers on the surface layers of top-half build-up portion of package substrate, and further connect to the SMT de-coupling capacitor. The number of stacked BU via arrays can provide the least inductance between the conductive layer at the top of the power filter circuit and SMT capacitor.

A single core-layer can be provided with top and bottom conductive layers separated by an insulating layer of third thickness, for example 800 μm; the insulating layer can have any thickness as long as the package substrate's stiffness is satisfactory.

The power filter circuit can further comprise a plurality of conductive layers separated by a plurality of insulating layers, each of the plurality of thicker insulating core layers having a third thickness; and a plurality of copper-clad laminate structures, each copper-clad laminate structure including conductive layers separated by a thicker insulating layer having a fourth thickness; the fourth thickness can be equal to third thickness, or can be another value.

The power filter circuit can comprise a core-less design in the core-substrate portion, wherein BU substrate layers are utilized to form the core-portion of substrate.

The power filter circuit can comprise a plurality of plated-through (PTH) vias displaced between the plurality of conductive layers of the core portions, forming the primary part of "π" power filtering structure, wherein each side or power isolating circuit of ""π" power filtering structure has a pair of plated-through vias in shunt. Each power isolating circuit, or side of the "π" power filtering structure, can be a single plated-through via or a few more plated-through vias in parallel.

One or more de-coupling capacitors can be placed on the surface conductive layer with one terminal of the capacitor attached to the power plane and other terminal attached to the ground plane. For example, SMT de-coupling capacitors can be provided in the format of multi-layer-ceramic-capacitor (MLCC) with option of least equivalent series inductance (ESL).

In another implementation, a power filter circuit is provided in a package substrate including single-layer core with conductive layers separated by an insulating layer or multi-layer core with a plurality of thicker insulating layers, each of the plurality of insulating core layers having a third thickness; and a plurality of copper-clad laminate structures, each copper-clad laminate structure including conductive layers separated by a thicker insulating layer having a fourth thickness. A plated-through via or via-array can be displaced between the plurality of conductive layers of the core portions, forming the primary part of "π" power filtering structure, or power isolation circuit. One or an array of multi-layer-ceramic-capacitors (MLCCs) can be embedded in one insulating layer at the top of core-substrate with one terminal of the capacitor attached to the power plane and other terminal attached to the ground plane. A pair of PTH vias and conductive layers can form the "π" power filtering structure wherein PLT via acting as legs of "π" filter structure, or power isolation circuits. In an example, a plurality of PTH vias form the "π" power filtering structure. In an example, a cascaded BU-via and PTH-via form the "π" power filtering structure with de-coupling capacitors embedded in the BU insulating layers.

In another implementation, a power filter circuit is provided in a package substrate including: build-up laminate layers with a plurality of conductive layers separated by a plurality of insulating layers; and a plurality of copper-clad laminate structures, each copper-clad laminate structure including conductive layers separated by an insulating layer; a single or a plurality of stacked build-via displaced between the plurality of conductive layers of the build-up portions; a package substrate including single-layer core with conductive layers separated by an insulating layer or multi-layer core with a plurality of thicker insulating layers; and a plurality of copper-clad laminate structures, each copper-clad laminate structure including conductive layers separated by a thicker insulating layer. A plated-through via or via-array is displaced between the plurality of conductive layers of the core portions, forming the primary part of the "π" power filtering structure, or power isolation circuit. One or more SMT de-coupling capacitors are placed on the surface conductive layer with one terminal of the capacitor attached to the power plane and other terminal attached to the ground plane. One planar inductor can be etched on one or two conductive layers inside the BU portion of package substrate acting as one leg of the "π" power filtering structure. The planar inductor can be formalized by any shape of spiral inductor.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A power filter circuit for use in a package substrate for integrated circuits, the power filter circuit comprising:
    a first power isolation circuit configured to isolate power provided to one or more die connectors for provision to an integrated circuit die, the first power isolation circuit having a first inductance;
    a second power isolation circuit configured to isolate power provided to one or more printed circuit board (PCB) connectors for provision to a PCB, the second power isolation circuit having a second inductance;
    a power plane electrically connecting a first end of the first power isolation circuit to a first end of the second power isolation circuit,
    a package ground network;
    a de-coupling capacitor in electrical communication with the power plane and with the package ground network; and
    one or more lower build-up (BU) layer vias provided in a lower BU layer of the package substrate and electrically connecting a mini power plane in a core layer of the package substrate with the one or more PCB connectors.

2. The power filter circuit of claim 1 wherein the second power isolation circuit comprises one or more core vias provided in a core layer of the package substrate.

3. The power filter circuit of claim 1 wherein the de-coupling capacitor comprises one or more surface mount (SMT) capacitors provided on a surface of the package substrate.

4. The power filter circuit of claim 1 wherein the de-coupling capacitor is in direct electrical communication with the package ground network.

5. The power filter circuit of claim 1 further comprising:
    one or more upper build-up (BU) layer vias provided in an upper BU layer of the package substrate and extending between and connecting the power plane with the package ground network and the de-coupling capacitor.

6. The power filter circuit of claim 5 wherein the de-coupling capacitor is in electrical communication with the power plane by way of the one or more upper BU layer vias.

7. The power filter circuit of claim 5 wherein the one or more upper BU layer vias comprises an array of upper BU layer vias.

8. The power filter circuit of claim 1 wherein the decoupling capacitor comprises an embedded capacitor provided in a core layer of the package substrate.

9. The power filter circuit of claim 1 wherein the first power isolation circuit comprises one or more core vias provided in a core layer of the package substrate.

10. The power filter circuit of claim 9 wherein the one or more core vias comprises a plurality of multi-stacked core vias provided in a core layer of the package substrate.

11. The power filter circuit of claim 1 wherein the second power isolation circuit comprises a planar inductor.

12. The power filter circuit of claim 11 wherein the planar inductor is provided on a surface layer, on a build-up layer or in a top core layer of the package substrate.

13. An integrated circuit package comprising:
a package substrate;
one or more die connectors provided on a first surface of the package substrate and configured to provide power to an integrated circuit die;
one or more printed circuit board (PCB) connectors provided on a second surface of the package substrate and configured to provide power to a PCB;
first and second power distribution networks (PDNs);
a power filter circuit provided in the package substrate, the power filter circuit comprising:
a first power isolation circuit configured to isolate power provided to the one or more die connectors, the first power isolation circuit having a first inductance;
a second power isolation circuit configured to isolate power provided to the one or more PCB connectors, the second power isolation circuit having a second inductance;
a first power plane electrically connecting a first end of the first power isolation circuit to a first end of the second power isolation circuit; and
a second power plane electrically connecting power to the first and second PDNs to provide a merged power plane within the package substrate.

14. The integrated circuit package of claim 13 further comprising:
a lower build-up (BU) layer provided between the power filter circuit and the one or more PCB connectors, the lower BU layer having a conductive layer,
the second power plane being provided on the conductive layer of the lower BU layer.

15. The integrated circuit package of claim 13 further comprising:
a lower build-up (BU) layer provided between the power filter circuit and the one or more PCB connectors, the lower BU layer comprising one or more lower BU layer vias electrically connecting the second power plane with the one or more PCB connectors.

* * * * *